United States Patent
He et al.

(10) Patent No.: US 12,067,257 B2
(45) Date of Patent: Aug. 20, 2024

(54) TESTING OPERATIONS FOR MEMORY SYSTEMS

(71) Applicant: Micron Technology, Inc., Boise, ID (US)

(72) Inventors: Yuan He, Boise, ID (US); Sujeet V. Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/949,867

(22) Filed: Sep. 21, 2022

(65) Prior Publication Data
US 2024/0094921 A1    Mar. 21, 2024

(51) Int. Cl.
G06F 3/06      (2006.01)
G11C 29/12    (2006.01)
G11C 29/42    (2006.01)

(52) U.S. Cl.
CPC .......... G06F 3/0619 (2013.01); G06F 3/0653 (2013.01); G06F 3/0673 (2013.01); G11C 29/1201 (2013.01); G11C 29/42 (2013.01); G11C 2029/1204 (2013.01)

(58) Field of Classification Search
CPC .... G06F 3/0619; G06F 3/0653; G06F 3/0673; G11C 29/42; G11C 29/1201; G11C 2029/1204
See application file for complete search history.

(56) References Cited

U.S. PATENT DOCUMENTS

| | | | | |
|---|---|---|---|---|
| 4,849,976 A | * | 7/1989 | Schilling | H03M 13/29 714/751 |
| 5,617,531 A | * | 4/1997 | Crouch | G11C 29/006 714/763 |
| 5,640,354 A | * | 6/1997 | Jang | G11C 29/44 365/201 |
| 6,473,346 B1 | * | 10/2002 | Kim | G11C 29/46 365/201 |
| 2011/0113191 A1 | * | 5/2011 | Pandya | G11C 15/043 711/108 |
| 2018/0219562 A1 | * | 8/2018 | Lee | G06F 11/1076 |
| 2023/0043306 A1 | * | 2/2023 | Wang | G11C 11/40622 |
| 2023/0114414 A1 | * | 4/2023 | SeyedzadehDelcheh | G11C 29/18 714/42 |

* cited by examiner

Primary Examiner — Samir W Rizk
(74) Attorney, Agent, or Firm — Holland & Hart LLP

(57) ABSTRACT

Methods, systems, and devices for testing operations for memory systems are described. A memory system may include a first circuit and a second circuit configured to test one or more counters tracking the quantity of activates to respective rows of memory cells. In some examples, the memory system may initiate an operation to validate a counter of the memory system. The first circuit may determine if a value of the counter is correct by comparing a set of counter bits representing the value of the counter to a set of parity bits. Subsequently, the second circuit may determine if the counter is incrementing correctly in accordance with a set quantity of activates to the corresponding row of memory cells. If the first circuit or the second circuit detect an error associated with the counter, the memory system may discard the row of memory cells associated with the faulty counter.

20 Claims, 7 Drawing Sheets

TESTING OPERATIONS FOR MEMORY SYSTEMS

FIELD OF TECHNOLOGY

The following relates to one or more systems for memory, including testing operations for memory systems.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
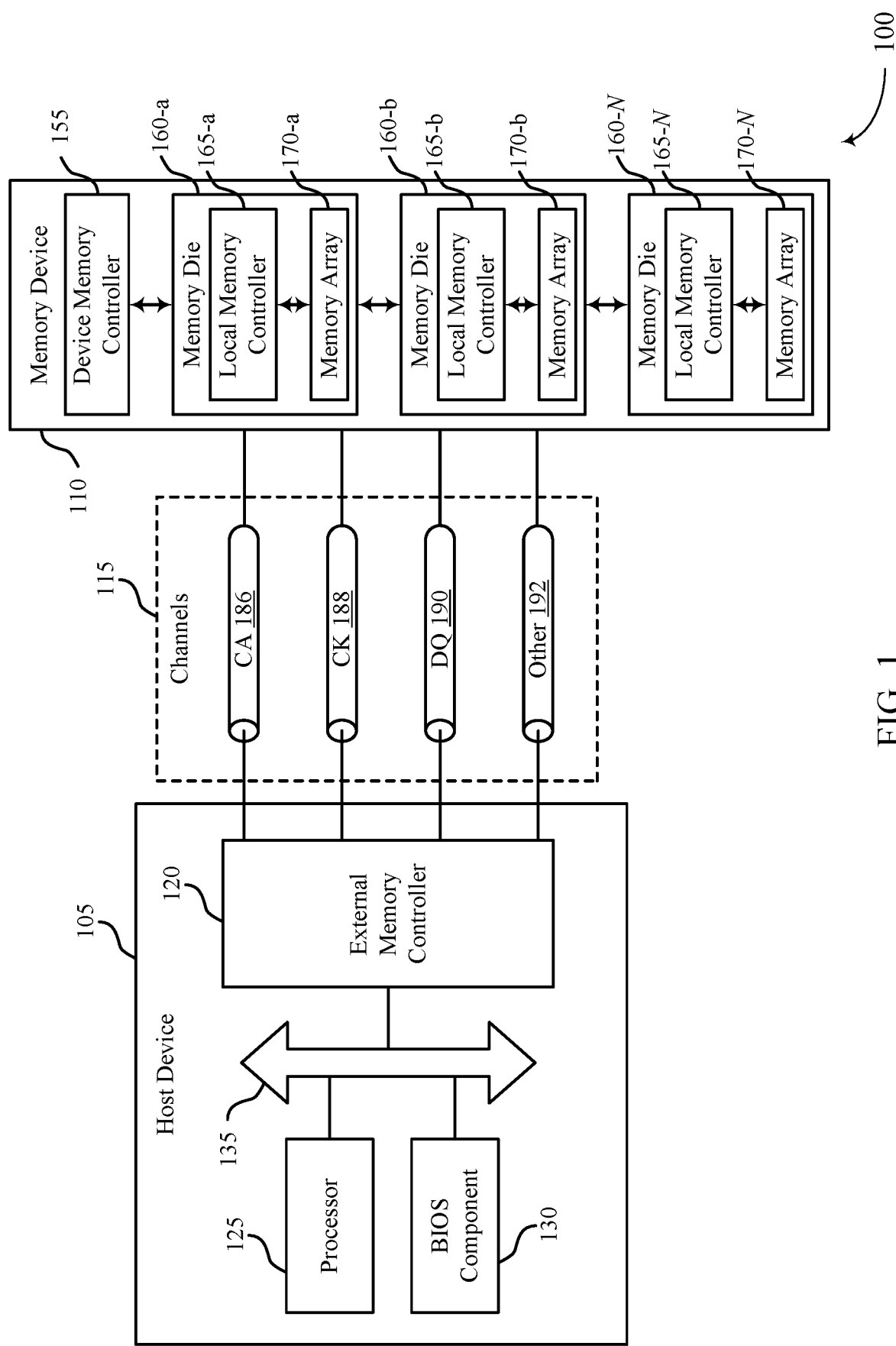
FIG. 1 illustrates an example of a system that supports testing operations for memory systems in accordance with examples as disclosed herein.

In some cases, a memory system may implement a scheme (e.g., a deterministic scheme, a probabilistic scheme) to detect repeated activates of one or more rows of memory cells (e.g., row hammering). For example, the memory system may include one or more counters to track a quantity of times each row of memory cells is activated. If a value of a counter satisfies a threshold, the counter may output an indication of such and, in response, the memory system may repair (e.g., refresh) affected rows to mitigate the effects of row hammering. Such effects may include charge leakage or reduced data retention capabilities on rows adjacent to the frequently accessed (e.g., hammered) row of memory cells. However, the one or more counters may utilize access lines (e.g., local input/output (LIO) lines), increasing latency between operations (e.g., access operations) of the memory system. Moreover, the one or more counters may occupy a relatively large area of the memory system, thus reducing memory cell density.

To address such issues, a memory system may include localized counters, where respective values of the counters may be stored in corresponding rows of memory cells of the memory system. Each counter may be maintained by circuitry integrated with (e.g., coupled to) the corresponding row of memory cells. Additionally, the circuitry may be configured to transmit signaling via a global input/output line (GIO) line of the memory system (e.g., as opposed to LIO lines). However, testing (e.g., external testing) of the local counters may be limited due to the location and configuration of the local counters. Accordingly, methods to improve testing of the local counters may be desirable to validate a row hammer mitigation scheme employed by the memory system.

In accordance with techniques as described herein, a memory system may include a first circuit (e.g., an error correction code (ECC) circuit) and a second circuit (e.g., a bank of multiplexers) configured to test one or more counters tracking the quantity of times respective rows of memory cells are activated, where the value of the counter is stored to the row of memory cells. In some cases, the second circuit may be configured to maintain the counter during general operation of the memory system. The memory system may initiate an operation (e.g., a testing operation) to validate a counter of the memory system. During a first portion of the testing operation, the first circuit may determine if a value of the counter is valid (e.g., correct) by comparing a set of counter bits representing the value of the counter to a set of parity bits. During a second portion of the testing operation, the memory system may activate the row of memory cells associated with the counter a quantity of times (e.g., 16 times). The second circuit may increment the value of the counter for each activate, and may determine if the counter is incrementing correctly. If the first circuit or the second circuit detects a fault associated with the counter, the memory system may discard the row of memory cells associated with the faulty counter (e.g., discard a memory bank including the row of memory cells, discard a memory die including the row of memory cells). Such techniques may enable testing of local counters associated with respective rows of memory cells of the memory system and, accordingly, the memory system may validate the local counters and the row hammer mitigation scheme utilizing the local counters.

Features of the disclosure are initially described in the context of systems and dies as described with reference to FIGS. 1 and 2. Features of the disclosure are described in the context memory system and a process flow diagram as described with reference to FIGS. 3 and 4. These and other features of the disclosure are further illustrated by and described with reference to an apparatus diagram and flowcharts that relate to testing operations for memory systems as described with reference to FIGS. 5 and 6.

FIG. 1 illustrates an example of a system 100 that supports testing operations for memory systems in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, a memory device 110 may implement a scheme (e.g., a deterministic scheme, a probabilistic scheme) to detect repeated activates of one or more rows of memory cells (e.g., of a memory die 160). For example, the memory device 110 may include one or more counters to track a quantity of times each of the rows of memory cells is activated. If a value of a counter satisfies a threshold, the counter may output an indication of such, and, in response, the memory device 110 may repair (e.g., refresh) affected rows to mitigate the effects of row hammering (e.g., charge leakage). In some examples, respective values of the counters may be stored in corresponding rows of memory cells of a memory die 160, and each counter may be maintained by circuitry integrated with the corresponding row of memory cells. Additionally or alternatively, the circuitry may be configured to transmit signaling (e.g., transmit an indication of an overflow condition) via a global input/output line (GIO) line of the memory die 160.

In accordance with techniques as described herein, a memory device 110 may include a first circuit (e.g., an error correction code (ECC) circuit) and a second circuit (e.g., a bank of multiplexers) configured to test one or more counters tracking the quantity of times respective rows of memory cells (e.g., of a memory die 160) are activated, where the value of the counter is stored to the row of memory cells. The memory device 110 may initiate an operation (e.g., a testing operation) to validate a counter. During a first portion of the testing operation, the first circuit may determine if a value of the counter is valid (e.g., correct) by comparing a set of counter bits representing the value of the counter to a set of parity bits. During a second portion of the testing operation, the memory device 110 may activate the row of memory cells associated with the counter a quantity of times (e.g., 16 times). The second circuit may increment the value of the counter for each activate, and may determine if the counter is incrementing correctly. If the first circuit or the second circuit detect a fault associated with the counter, the memory device 110 may discard the row of memory cells associated with the faulty counter. Such techniques may enable testing of local counters associated with respective rows of memory cells of the memory device 110, and, accordingly, the memory device 110 may validate the local counters and the row hammer mitigation scheme operating based on the local counters.

Figure 2:
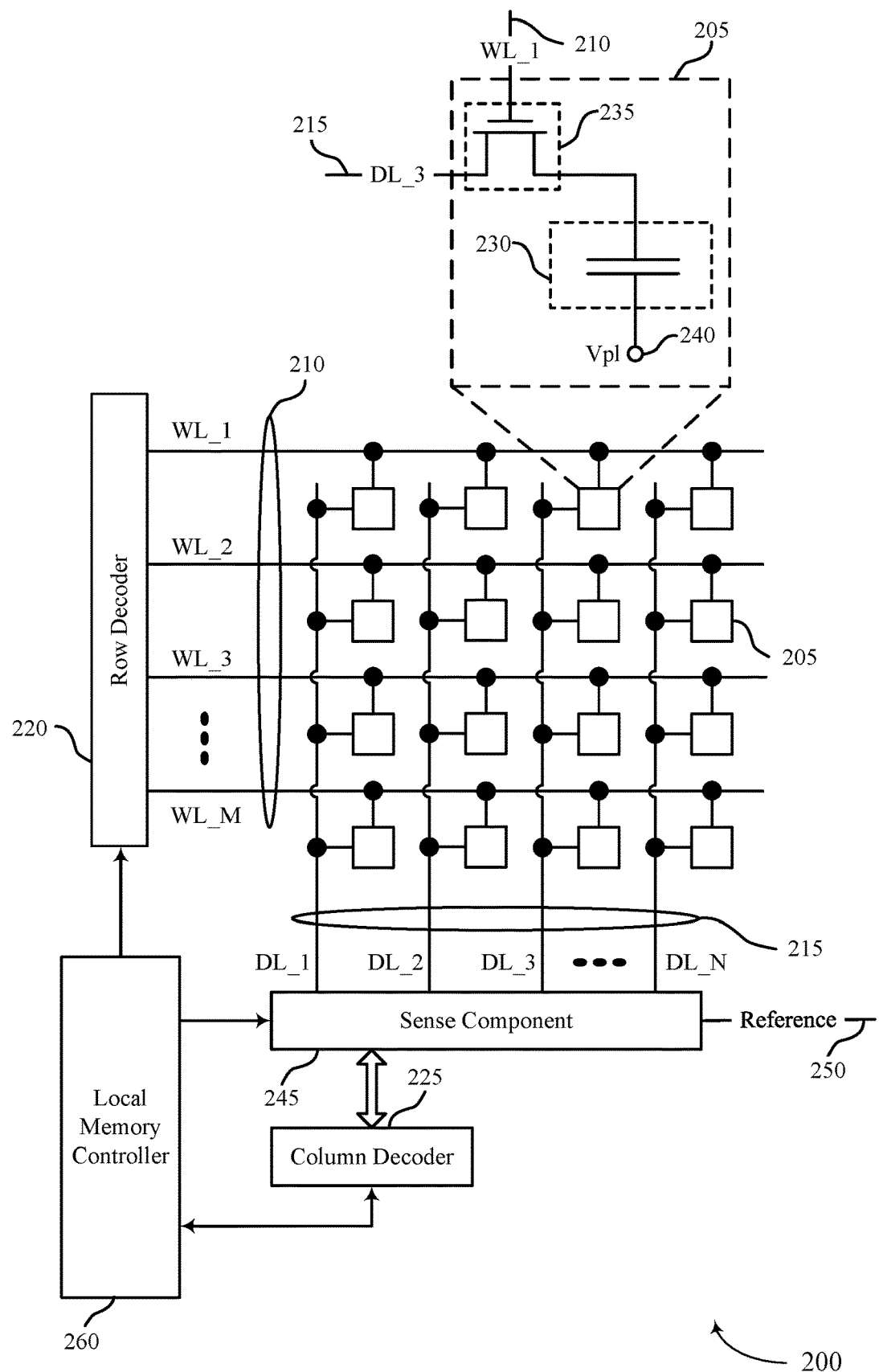
FIG. 2 illustrates an example of a memory die that supports testing operations for memory systems in accordance with examples as disclosed herein.

FIG. 2 illustrates an example of a memory die 200 that supports testing operations for memory systems in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a local counter (not shown) as described with reference to FIG. 3A, or any combination thereof. For example, a row decoder 220 may receive a row address from the local memory controller 260 and activate a word line 210 based on the received row address. A local counter may receive a column address from the local memory controller 260 and may activate a digit line 215 based on the received column address. Additionally or alternatively, the memory die 200 may include a column decoder 225 coupled with the sense component 245. The column decoder 225 may provide one or more bits (e.g., one or more ECC bits) to the local memory controller 260.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to local counter), and may indicate the detected logic state to another component of a memory device (e.g., a memory device 110) that includes the memory die 200.

The local memory controller 260 may control the accessing of memory cells 205 through the various components (e.g., row decoder 220, local counter, sense component 245). The local memory controller 260 may be an example of the local memory controller 165 described with reference to FIG. 1. In some examples, one or more of the row decoder 220, local counter, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some cases, a memory die 200 may implement a scheme (e.g., a deterministic scheme, a probabilistic scheme) to detect repeated activates of one or more rows of memory cells 205 (e.g., row hammering). For example, the memory die 200 may include one or more counters to track a quantity of times each of the rows of memory cells 205 is activated. If a value of a counter satisfies a threshold, the counter may output an indication of such, and, in response, the memory die 200 may repair (e.g., refresh) affected rows to mitigate the effects of row hammering (e.g., charge leakage). In some examples, respective values of the counters may be stored in corresponding rows of memory cells 205 of a memory die 200, and each counter may be maintained by circuitry integrated with the corresponding row of memory cells 205. Additionally or alternatively, the circuitry may be configured to transmit signaling (e.g., transmit an indication of an overflow condition, for example) via a global input/output line (GIO) line of the memory die 200.

In accordance with techniques as described herein, a memory die 200 may include a first circuit (e.g., an error correction code (ECC) circuit) and a second circuit (e.g., a bank of multiplexers) configured to test one or more counters tracking the quantity of times respective rows of memory cells 205 are activated, where the value of the counter is stored to the row of memory cells 205. The memory die 200 may initiate an operation (e.g., a testing operation) to validate a counter. During a first portion of the testing operation, the first circuit may determine if a value of the counter is valid (e.g., correct) by comparing a set of counter bits representing the value of the counter to a set of parity bits. During a second portion of the testing operation, the memory die 200 may activate the row of memory cells 205 associated with the counter a quantity of times (e.g., 16 times). The second circuit may increment the value of the counter for each activate, and may determine if the counter is incrementing correctly. If the first circuit or the second circuit detect a fault associated with the counter, the row of memory cells 205 associated with the faulty counter may be discarded (e.g., a memory bank including the row of memory cells 205, the memory die 200). Such techniques may enable testing of local counters associated with respective rows of memory cells 205 of the memory die 200, and, accordingly, the memory die 200 may validate the local counters and the row hammer mitigation scheme operating based on the local counters.

Figure 3:
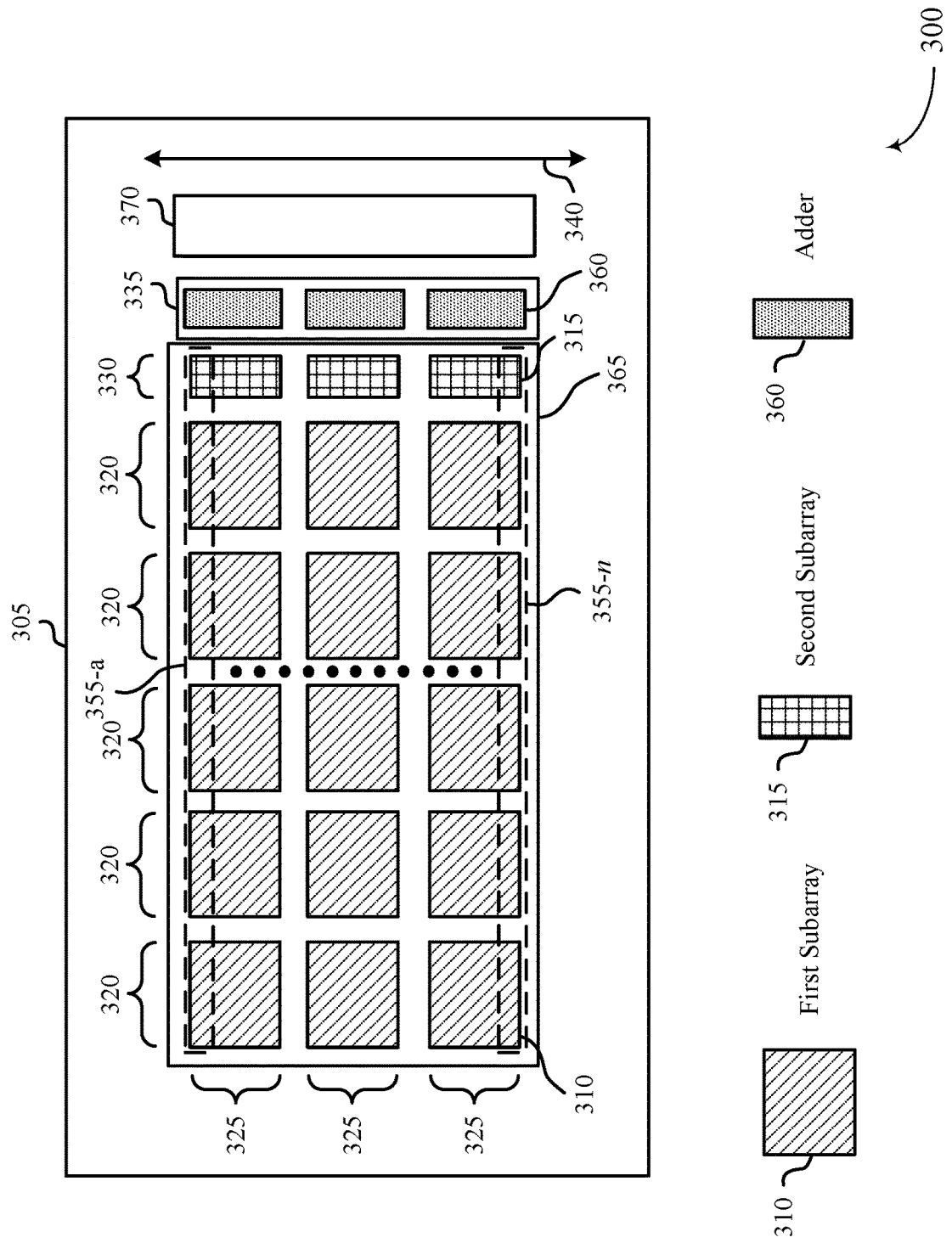
FIG. 3 illustrates an example of a memory system that supports testing operations for memory systems in accordance with examples as disclosed herein.

FIG. 3 illustrates an example of a memory system 300 that supports testing operations for memory systems in accordance with examples as disclosed herein. The memory system 300 may include a memory die 305. The memory die 305 may operate in accordance with a row hammer mitigation scheme (e.g., a deterministic scheme), where the row hammer mitigation scheme may utilize counters (e.g., local counters) to track activates to each row of memory cells 355 of the memory die 305. In such examples, the memory die 305 may be configured to support testing (e.g., external testing) of the counters. The testing may validate (or invalidate) the operation of the local counters and, by extension, the row hammer mitigation scheme which utilizes the local counters.

In some examples, the memory die 305 may include a memory bank 365, where the memory bank 365 includes one or more first subarrays 310 and one or more second subarrays 315. The first subarrays 310 may be organized in a plurality of columns 320 and a plurality of rows 325. Although the memory bank 365 is depicted as including five columns 320 and three rows 325 of the first subarrays 310, the memory bank 365 may include any quantity of first subarrays 310 (e.g., tens of subarrays 310, hundreds of subarrays 310) in accordance with alternative configurations of the columns 320 and the rows 325. The first subarrays 310 may each include a proportion (e.g., a subset) of one or more of the rows of memory cells 355, where such proportions are configured to store data from a host device. The rows of memory cells 355 may extend through (e.g., be shared by) first subarrays 310 and second subarrays 315 in a same row 325. local input/output (LIO) lines (not shown) may extend along (e.g., be located between, separate) respective columns 320 and rows 325 of first subarrays 310 and couple each of the first subarrays 310 to sensing circuitry (not shown). Biasing LIO lines (e.g., driving from a first voltage level to a second voltage level) may activate select rows of memory cells 355 to facilitate access operations (e.g., read operations, write operations) to the memory bank 365.

In some examples, the second subarrays 315 may be organized in a column 330 (e.g., including multiple rows 325) extending alongside the first subarrays 310 (e.g., alongside an outermost column 320). The second subarrays 315 may include a proportion (e.g., a subset) of each of the rows of memory cells 355, and may include a different quantity of memory cells than the first subarrays 310 (e.g., a smaller proportion of each of the rows of memory cells 355). In some cases, proportions of the rows of memory cells 355 in the second subarray 315 may each include memory cells that store one or more bits representing a value of a counter (e.g., a set of counter bits, a set of 16 counter bits) corresponding to the respective row of memory cells 355, where the counter tracks a quantity of activates to the respective row of memory cells 355 (e.g., a quantity of times a respective row is accessed). For example, a value of a count corresponding to the row of memory cells 355-*a* may be stored to memory cells of the row of memory cells 355-*a* (e.g., in a second subarray 315). In some examples, a proportion of the set of counter bits (e.g., 4 counter bits) may be redundant to the value of the counter.

In some examples, the memory die 305 may include a first circuit 370, where the first circuit 370 may be an example of an error correction code (ECC) circuit, and the first circuit 370 may be shared by multiple memory banks (e.g., two memory banks) of the memory die 305. The first circuit 370 may be coupled to the memory bank 365 (e.g., coupled to one or more of the rows of memory cells 355) via a conductive line (e.g., a column select (CS) line, a hybrid CS line; not shown) and selectively coupled to a global input/output (GIO) line 340 (e.g., a test GIO line). The first circuit 370 may be configured to perform one or more parity check operations on the memory bank 365 (e.g., during general operation, in accordance with a testing procedure). For example, the first circuit 370 may be configured to generate and store a set of parity bits corresponding to the value of a counter, where the first circuit 370 may generate and store a set of parity bits following a respective counter being incremented (e.g., by the second circuit 335) and in accordance with an activation of the corresponding row of memory cells 355. During a testing operation, the first circuit 370 may validate the value of a counter by performing a comparison between the set of counter bits representing the value of the counter and the corresponding set of parity bits stored to the first circuit 370. In some examples, the first circuit 370 may be shared (e.g., coupled with) two or more memory banks of the memory die 305, in which, for example, the first circuit 370 may be coupled with the memory bank 365 via the conductive line and a second memory bank (not shown) of the memory die 305 via a second conductive line (e.g., a second CS line). In such examples, the first circuit 370 may be adjacent to (e.g., located between, in a gap of the memory die 305) the two memory banks.

In some examples the memory die 305 may include a second circuit 335 (e.g., a bank of multiplexers), where the second circuit 335 may be integrated with (e.g., coupled to) to the memory bank 365 (e.g., to one or more rows of memory cells 355) via the conductive line and selectively coupled to the GIO line 340. The second circuit 335 may be configured to maintain (e.g., increment) the value of a counter for each respective row of memory cells 355. In some examples, the second circuit 335 may include one or more adders 360, where the adders 360 may each correspond to (e.g., be integrated with) a second subarray 315, and may increment respective values of the counter for each of the row of memory cells 355 including a proportion of memory cells in the corresponding second subarray 315. In such examples, an adder 360 may be a circuit (e.g., including one or more multiplexers) configured to increment the value of a counter in response to an activation of the corresponding row, where the adder 360 may adjust (e.g., update) the value of one or more bits of the set of bits representing the value of the counter. The second circuit 335 may be further configured to validate the counter in conjunction with the first circuit 370 during a testing procedure. For example, the second circuit 335 may be configured to determine if the counter is incrementing correctly.

In some examples, the memory system 300 may initiate a testing operation on a counter associated with the row of memory cells 355-a. For example, the memory system 300 may initiate the testing operation based on receiving a command from an external device (not shown). In such examples, the memory system 300 may be configured to selectively couple the first circuit 370 and the second circuit 335 to the GIO line 340, where the first circuit 370 and the second circuit 335 may transmit (e.g., output) signaling to the external device via the GIO line 340 during testing.

During a first portion of the testing operation, the memory system 300 may selectively couple the first circuit 370 to the GIO line 340 (e.g., in accordance with a first test signal) by enabling an output driver of the first circuit 370. The first circuit 370 may determine if there is a defect (e.g., one or more incorrect bits) in the set of bits representing the value of the counter. For example, the first circuit 370 may read a set of counter bits representing the value of a counter from the row of memory cells 355-a (e.g., via the conductive line). In some cases, the first circuit 370 may determine if a first subset (e.g., a subset of even counter bits) matches a first subset of a set of parity bits (e.g., a subset of even parity bits) stored to the first circuit 370 and associated with the value of the counter. Additionally or alternatively, the first circuit 370 may determine if a second subset (e.g., a subset of odd counter bits) matches a second subset of the set of parity bits (e.g., a subset of odd parity bits).

In such examples, if both of the first or the second subsets of the set of counter bits does not match the corresponding subset of the set of parity bits, one or more bits of the set of counter bits may be incorrect, and, accordingly, the value of the counter may be incorrect. Based on this determination, the first circuit 370 may generate a parity flag (e.g., a first flag) including one or more encoded bits and indicating a condition (e.g., a defect or lack thereof) associated with the value of the counter. In some cases, if the first subset of the set of counter bits matches the first subset of the set of parity bits, the circuit 370 may refrain from comparing the second subset of the set of counter bits to the second subset of the set of parity bits as the subsequent comparison may be redundant to the determination. The first circuit 370 may be operable to transmit the flag to the external device via the GIO line 340. By testing even and odd subsets of the set of counter bits independently, testing performed by the first circuit 370 may be more efficient.

During a second portion of the testing operation, the memory system 300 may selectively couple the second circuit 335 to the GIO line 340 (e.g., in accordance with a second test signal) by enabling an output driver of the second circuit 335. In some examples, the second circuit 335 may determine if the counter is incrementing correctly. In testing, the counter (e.g., the 16 bit counter) may be segmented into four sub-counters each including a subset of the set of counter bits (e.g., 4 bits each, third subset of counter bits, fourth subset of counter bits) in accordance with mode signaling to the second circuit 335 (e.g., enable test fuse mode signaling). Subsequently, the memory system 300 may activate the row of memory cells 355-a a first quantity of times (e.g., 16 times), and the sub-counters may increment a test value for each of the activations. Incrementing the counters may include adjusting (e.g., updating, changing a value of) one or more bits of each the subset of bits. Following the first quantity of activations, each of the subset of bits of the sub-counters may match an expected value (e.g., '1000'), and the second circuit 335 may output counter flags including the most significant bit (e.g., '1', '0') to an external device (e.g., a tester) via the GIO line 340, where the counter flag (e.g., the most significant bit) may denote an error or lack thereof of the associated subset of the set of counter bits.

The external device may concatenate each output bit to generate a vector of most significant digits, and may compare the vector to an expected vector (e.g., '1111'), where the expected vector represents the expected output of the 4 sub-counters. As such, the external device may determine if each of the four sub-counters are incrementing correctly. For example, the relative position of a '0' (e.g., as opposed to an expected '1') within the vector may indicate which sub-counter is defective, as a sub-counter output of '0' as the most significant digit may be incorrect (e.g., invalid). Accordingly, the external device may determine errors associated with one or more subsets of the set of counter bits based on the output of the sub-counters. The memory system 300 may test the sub-counters concurrently or sequentially. To test the sub-counters sequentially, the memory die 305 may activate the row of memory cells 305-a an additional quantity of times after the first quantity of times (e.g., activate a second quantity of times).

In such examples, the external device may receive one or more flags (e.g., one or more indications of a fault) from the first circuit 370, the second circuit 335, or both. Based on the received flags, the external tester may determine the validity of the operation of the counter associated with the row of memory cells 355-a, and may transmit or refrain from transmitting a command to discard the row of memory cells 355-a (e.g., to discard the memory bank 365, to discard the memory die 305) to the memory system 300. In response to receiving the command, the memory system 300 may discard the row of memory cells 355-a (e.g., discard the memory bank 365, discard the memory die 305). Alternatively, if no such command is received, the memory system 300 may refrain from discarding the row of memory cells 355-a (e.g., the memory bank 365 may be maintained, the memory die 305 may be maintained). By performing external testing on local counters of the memory system 300, the local counters and, by extension, the row hammer mitigation scheme which utilizes the local counters may be validated.

Figure 4:
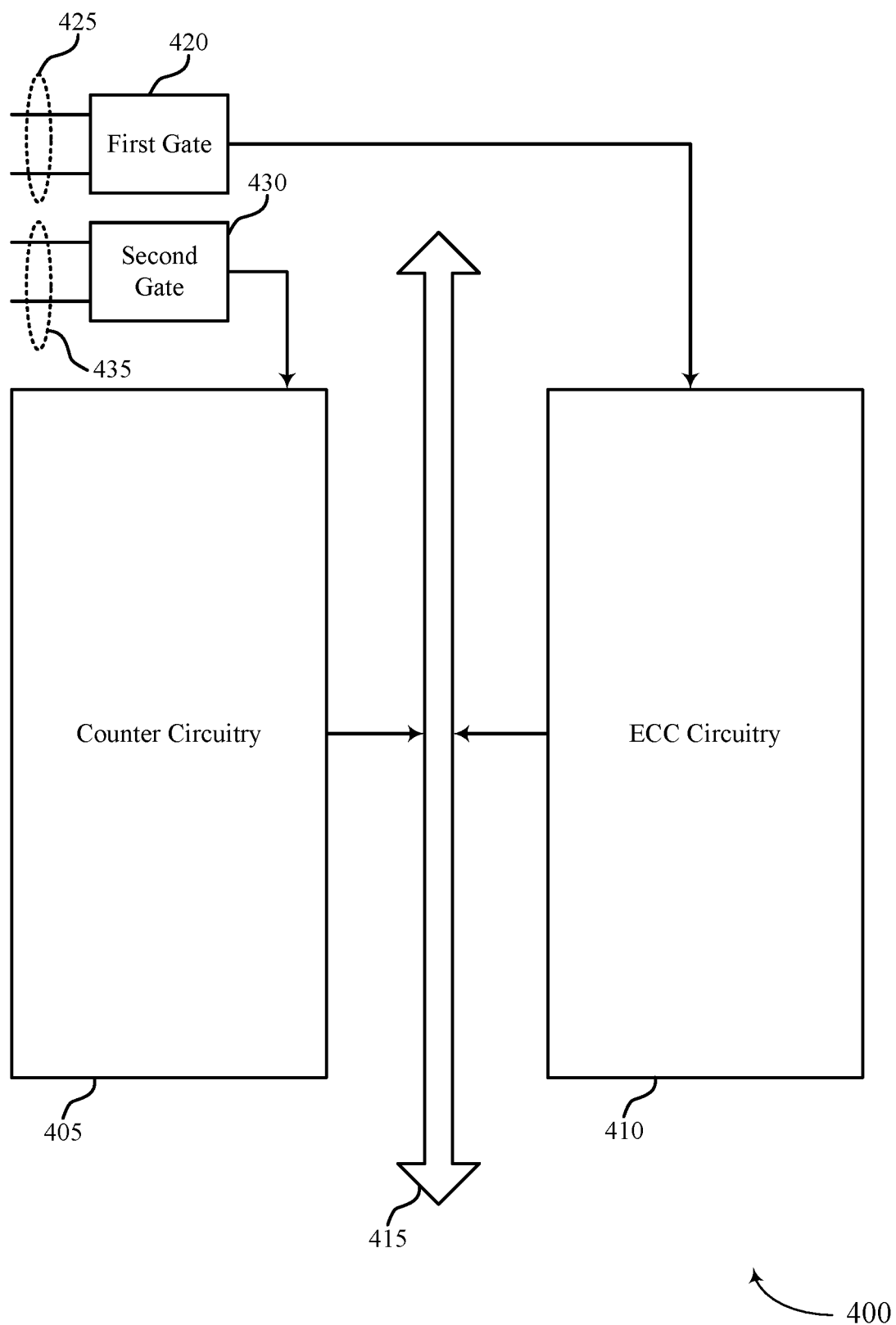
FIG. 4 illustrates an example of a memory system that supports testing operations for memory systems in accordance with examples as disclosed herein.

FIG. 4 illustrates an example of a system 400 that supports testing operations for memory systems in accordance with examples as disclosed herein. The system 400 may include counter circuitry 405 and ECC circuitry 410. In some examples, the counter circuitry 405 and the ECC circuitry 410 may be coupled with an output line 415 (e.g., a GIO line 415) and share the output line 415 for signaling with other devices. The ECC circuitry 410 may be coupled with a first gate 420 and the counter circuitry 405 may be coupled with a second gate 405. The first gate 420 may be configured to send a signal that couples the ECC circuitry 410 with the output line 415. The second gate 430 may be configured to send a signal that couples the counter circuitry 405 to the output link 415. The counter circuitry 405 and the ECC circuitry 410 may each be selectively coupled with the output line 415 and tested based on a value (e.g., a signal) output from the respective gates. The testing may validate (or invalidate) the operation of the ECC circuitry and local counters and, by extension, the row hammer mitigation scheme which utilizes the local counters.

In some examples, the first gate 420 may be coupled with input lines 425. For example, the input lines may include a first input line configured to provide a first signal (e.g., a Test_ECC signal) to the first gate 420 and a second input line configured to provide a second signal (e.g., a SecEn) signal to the first gate. When the first signal is provided, the first gate 420 may output a signal to the ECC circuitry 410 to couple the ECC circuitry 410 with the output line 415 and/or initiate a testing operation. In some cases, a multiplexer or other gating component may selectively couple the ECC circuitry 410 with the output line 415 based on the signal output form the first gate 420.

The second gate 430 may be coupled with input lines 435. For example, the input lines may include a first input line configured to provide a first signal (e.g., a Test_RHC signal) to the second gate 430 and a second input line configured to provide a second signal (e.g., a SecEn) signal to the first gate. When the first signal is provided, the second gate 430 may output a signal to the counter circuitry 405 to couple the counter circuitry 405 with the output line 415 and/or initiate a testing operation. In some cases, a multiplexer or other gating component may selectively couple the counter circuitry 405 with the output line 415 based on the signal output form the second gate 430.

When the ECC circuitry 410 is tested, data and associated parity bits may be read from one or more memory cells. For example, data may be read from one or more rows of memory cells and the data may be associated with eight (8) corresponding parity bits. The ECC circuitry 410 may generate a set of parity bits using the data and may compare a first subset (e.g., half, the even bits) of the generated parity bits to respective parity bits associated with the data. If the bits match, the ECC circuitry 410 may blow one or more fuses (e.g., as described with reference to FIG. 5) and may output a flag to the GIO line 415. Another external device (e.g., a tester) may receive the flag sent via the GIO line 415 and may evaluate the results of the testing. In some instances, if the bits match, then the ECC circuitry 410 may be functioning correctly.

If the first subset of parity bits do not match, the ECC circuitry 410 may compare a second subset (e.g., half, the odd bits) of the generated parity bits to respective parity bits associated with the data. If the bits match, the ECC circuitry 410 may blow one or more fuses (e.g., as described with reference to FIG. 5) and may output a flag to the GIO line 415. In some instances, if the bits match, then the ECC circuitry 410 may be functioning correctly and may have otherwise incorrectly determined an error when comparing the even bits. If the odd bits do not match, the ECC circuitry 410 may be functioning incorrectly and may output a flag to the GIO line 415 indicating such.

When the counter circuitry 405 is tested, the counter circuitry 405 may increment a first test counter, where the value of the first test counter is represented by one or more counter bits, and may determine whether the counter bits match an expected value following the incrementation.

In such cases, the counter circuitry 405 may activate the row of memory cells a first quantity of times, and may adjust one or more counter bits in response to each of the activates to count the first quantity of activates (e.g., 16 activates). For example, the counter circuitry 405 may track the quantity of activates using a linked path between multiplexers (e.g., between respective multiplexer inputs), where a bit of the counter is output from a first multiplexer to a second multiplexer in accordance with the first quantity of activates (e.g., a portion of the first quantity of activates). The bit may be input to the first multiplexer along a first input line (e.g., of a plurality of input lines to the first multiplexer), and may represent a least significant bit of the test counter. The bit may be output from the first multiplexer to a second multiplexer and may represent a next most significant bit. That is, a relative position of the bit along the linked path (e.g., with respect to the multiplexers) may indicate a significance of the bit.

In some cases, the counter circuitry 405 may generate a flag (e.g., first flag) based on activating the row of memory cells the first quantity of times, where the first flag indicates an error condition. In some examples, following the first quantity of activates, the counter bits may match an expected binary value (e.g., '1000'), and the first flag may include the most significant bit (e.g., '1'). The counter circuitry 405 may output the first flag to the GIO line 415. If the value of the first flag matches the expected value (e.g., '1'), the first test counter may be incrementing correctly. If the value of the first flag does not match the expected value (e.g., '0'), the first test counter may not be incrementing correctly and there may be an error associated with the corresponding row.

The counter circuitry 405 may similarly test other counters by selecting a corresponding linked path through one or more of the plurality of multiplexers. The counter circuitry 405 may thus activate a row of memory cells a set quantity of times (e.g., 16 times), and may generate and transmit an associated flag. In some examples, when errors are found in two or more rows of memory cells, the counter circuitry 405 may refrain from further testing and may output a flag (e.g., a second flag) indicating the error condition. Another external device (e.g., a tester) may receive the flag sent via the GIO line 415 and may evaluate the results of the testing. By performing external testing on local counters and ECC circuitry of the memory system 400, the ECC circuitry and local counters may be validated.

Figure 5:
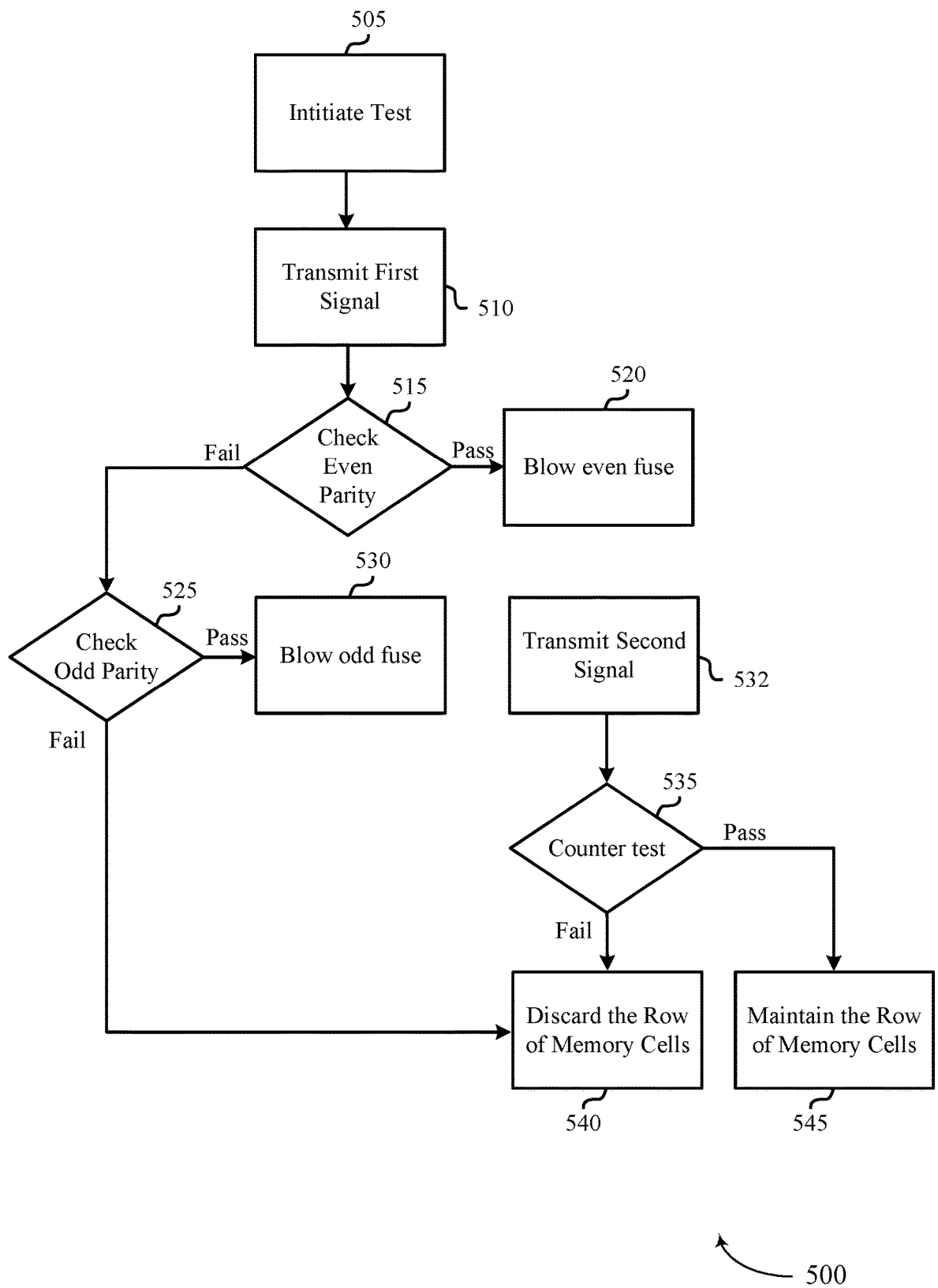
FIG. 5 illustrates an example of a process flow diagram that supports testing operations for memory systems in accordance with examples as disclosed herein.

FIG. 5 illustrates an example of a process flow diagram 500 that supports testing operations for memory systems in accordance with examples as disclosed herein. Aspects of the process flow diagram 500 may be implemented by a memory system described with reference to FIGS. 1 through 5. The memory system may be an example of the memory system 300 as described with reference to FIG. 3, and may include a memory die. The memory die may include a memory bank and a first circuit and a second circuit coupled to the bank of memory cells. The process flow diagram 500 may depict a process for testing local counters of the memory bank by an external device. Testing local counters may validate (or invalidate) a row hammer mitigation scheme implemented by the memory system.

In some cases, one or more aspects of the process flow diagram 500 may be implemented by a controller (e.g., among other components), of the memory system. Additionally or alternatively, the aspects of the process flow diagram 500 may be implemented as instructions stored in the memory system, or by the circuitry of the memory system. For example, the instructions, if executed by a controller, may cause the memory system to perform one or more of the operations of the process flow diagram 500. Alternative examples of the process flow diagram 500 may be implemented in which some operations are performed in a different order than described, or not performed at all. In some cases, operations may include features not mentioned below, or additional operations may be added.

At 505, the memory system may initiate a test operation for a circuit (e.g., an ECC circuit as described with reference to FIG. 4) associated with the memory bank. For example, the memory system may initiate the test operation based on a command from an external device (e.g., a tester). In such examples, the test operation may be performed to validate (or invalidate) the ECC circuitry associated with the memory bank.

At 510, the memory system may transmit a first signal (e.g. a first test mode signal) to a first circuit of the memory system, where the first circuit may be an example of ECC circuitry and may be coupled with the memory bank. In some examples, transmitting the first test mode signal may couple (e.g., selectively couple) the first circuit to a GIO line by enabling an output driver of the first circuit. Additionally or alternatively, the first circuit may initiate testing of its ECC capabilities based on receiving the first test mode signal or based on receiving additional signaling from the memory system, and may read (e.g., retrieve) one or more bits of a set of parity bits from the memory bank.

At 515, the first circuit may determine whether a first subset (e.g., an even subset) of parity bits contain an error. For example, the first subset of parity bits may be generated using data read from one or more memory cells and may be compared to a respective subset of parity bits associated with the data (e.g., a respective subset of parity bits stored with the data). If the parity bits match, the first circuit may generate a first parity flag (e.g., a first flag) indicating a result of the comparison. For example, the parity flag may indicate that the first subsets match, and the first circuit did not determine an error in the ECC circuitry. Alternatively, the parity flag may indicate that the first subsets do not match. The first circuit may transmit the parity flag to the external device via the GIO line.

If, at 515, the first circuit determined that the first subset of parity bits matches the stored parity bits, the first circuit may blow a first fuse (e.g., an 'even' fuse) included in or coupled with the first circuit. For example, the first circuit may blow the first fuse by driving current (e.g., above a threshold value of current) across the first fuse. By blowing the first fuse, the first circuit may be configured to test the first subset of the set of parity bits against the stored set of parity bits (e.g., perform an even parity test) during general operation to validate the ECC circuitry. Additionally or alternatively, the memory system may decouple (e.g., selectively decouple) the first circuit from the GIO line by disabling the output driver of the first circuit.

If, at 515, the first circuit determined that the first subset of the set of parity bits does not match the stored parity bits, the first circuit may compare a second subset of the set of parity bits (e.g., odd parity bits) to respective stored parity bits at 525. If the second subset of the set of parity bits matches the stored parity bits, the set of parity bits may represent an expected value, and the mismatch (e.g., at 515) may have been due to a fault in the first subset of the set of parity bits. Alternatively, if the second subsets do not match, there may be a fault in the set of parity bits. The first circuit may generate a second parity flag indicating a result of the comparison between the second subset of the set of parity bits to the stored parity bits at 530. For example, the second parity flag may indicate that the second subsets match, and the first circuit did not determine an error associated with the ECC circuitry. Alternatively, the second parity flag may indicate that the second subsets do not match, and the first circuit determined an error associated with the ECC circuitry. The first circuit may transmit the second parity flag to the external device via the GIO line.

If, at 525, the first circuit determined that the second subset of the set of parity bits matches the stored parity bits, the first circuit may blow a second fuse (e.g., an 'odd' fuse) included in or coupled with the second circuit. By blowing the second fuse, the first circuit may be configured to test the second subset of the set of parity bits against the respective stored parity bits (e.g., perform an odd parity test) during general operation to validate the value of the ECC circuitry. Additionally or alternatively, the memory system may decouple (e.g., selectively decouple) the first circuit from the GIO line by disabling the output driver of the first circuit.

At 532, the memory system may transmit a second signal (e.g., a second test mode signal) to a second circuit of the memory system to initiate a counter testing operation. In some instances, the second signal may be transmitted regardless of a result of the ECC testing operation (e.g., at 505). The second circuit may be operable to increment the value of the counter and may be coupled with the memory bank. In some examples, transmitting the second signal may couple (e.g., selectively couple) the second circuit to the GIO line by enabling an output driver of the second circuit. Additionally or alternatively, the second circuit may initiate counter test (e.g., testing counter incrementation) based on the second signal or based on receiving additional signaling from the memory system, and may read the set of counter bits representing the value of the counter from the memory bank or from the first circuit.

At 535, the memory system, in conjunction with the second circuit, may test the counter. The second circuit may segment the counter into 4 sub-counters each including a subset of the set of counter bits (e.g., a third subset, a fourth subset, for example), where each of the 4 sub-counters may be incremented (e.g., concurrently) based on activating the row of memory cells corresponding to the counter. In some examples, the memory system may activate the row of memory cells a first quantity of times (e.g., 16 times), and the sub-counters may increment for each activation by adjusting one or more bits included in a respective subset of the set of counter bits. In response to activating the row of memory cells the first quantity of times, the second circuit may determine if there is an error (e.g., a first error, a second error) in each of the four subsets of the set of counter bits. For example, the second circuit may generate 4 counter flags (e.g., second flags) corresponding to each of the 4 sub-counters, where a counter flag includes a most significant bit (e.g., a '1' or '0') associated with the corresponding sub-counter. In such cases, if a counter flag includes a '1,' the corresponding sub-counter may be incrementing properly as the bit matches the expected value. Alternatively, if a counter flag includes a '0,' the corresponding sub-counter may not be incrementing properly as the bit does not match the expected value, and the associated subset of the set of counter bits may include an error. If two or more of the subsets include an error, the counter may be invalid. The counter may increment properly during general operation if one of the subsets includes an error, as the subset including the error may be made redundant to the value of the counter (e.g., by blowing a fuse associated with the subset). The second circuit may output the 4 counter flags to the external device via the GIO line. Subsequently, the memory system may decouple the second circuit from the GIO line.

At 540, the memory system may discard the row of memory cells associated with the faulty counter (e.g., discard the memory bank including the row of memory cells, discard the memory die including the row of memory cells).

For example, the memory system may receive a command from the external device to discard the row of memory cells, and, in response to the command, the memory system may discard the row of memory cells. The external device may determine to discard the row of memory cells based on one or more flags (e.g., parity flags, counter flags) received from the first and second circuits. For example, if, at 515 and 525, it was determined that neither of the first subset or the second subset of the set of counter bits matches the corresponding subset of the set of parity bits, the external device may transmit the command to discard the row of memory cells. Additionally or alternatively, if at 535, it was determined that two or more of the subsets of the set of counter bits includes an error (e.g., does not match the expected value), the external device may transmit the command to discard the row of memory cells. In such examples, the flags transmitted by the memory system during the test operation may be representative of an indication of a failure associated with the counter.

At 545, the memory system may maintain the row of memory cells associated with the counter (e.g., maintain a memory bank including the row of memory cells, maintain a memory die including the row of memory cells). For example, the memory system may maintain the row of memory cells in response to a command (or lack thereof) from the external device following the testing operation. In such examples, the external device may have determined the counter is functioning properly based on the flags (e.g., parity flags, counter flags) received during testing. The memory system may maintain the row of memory cells if either the first subset or the second subset of the set of counter bits matches the corresponding subset of the set of parity bits, and if errors were found in fewer than two of the four subsets of the set of counter bits associated with sub-counters in the counter test.

By validating the counter and the ECC circuitry, the memory system may ensure that it is operating in accordance with a deterministic row hammer scheme. Furthermore, the test operation allows the memory system to identify and discard rows of memory cells (e.g., of a memory bank, of a memory die) including a fault counter.

Figure 6:
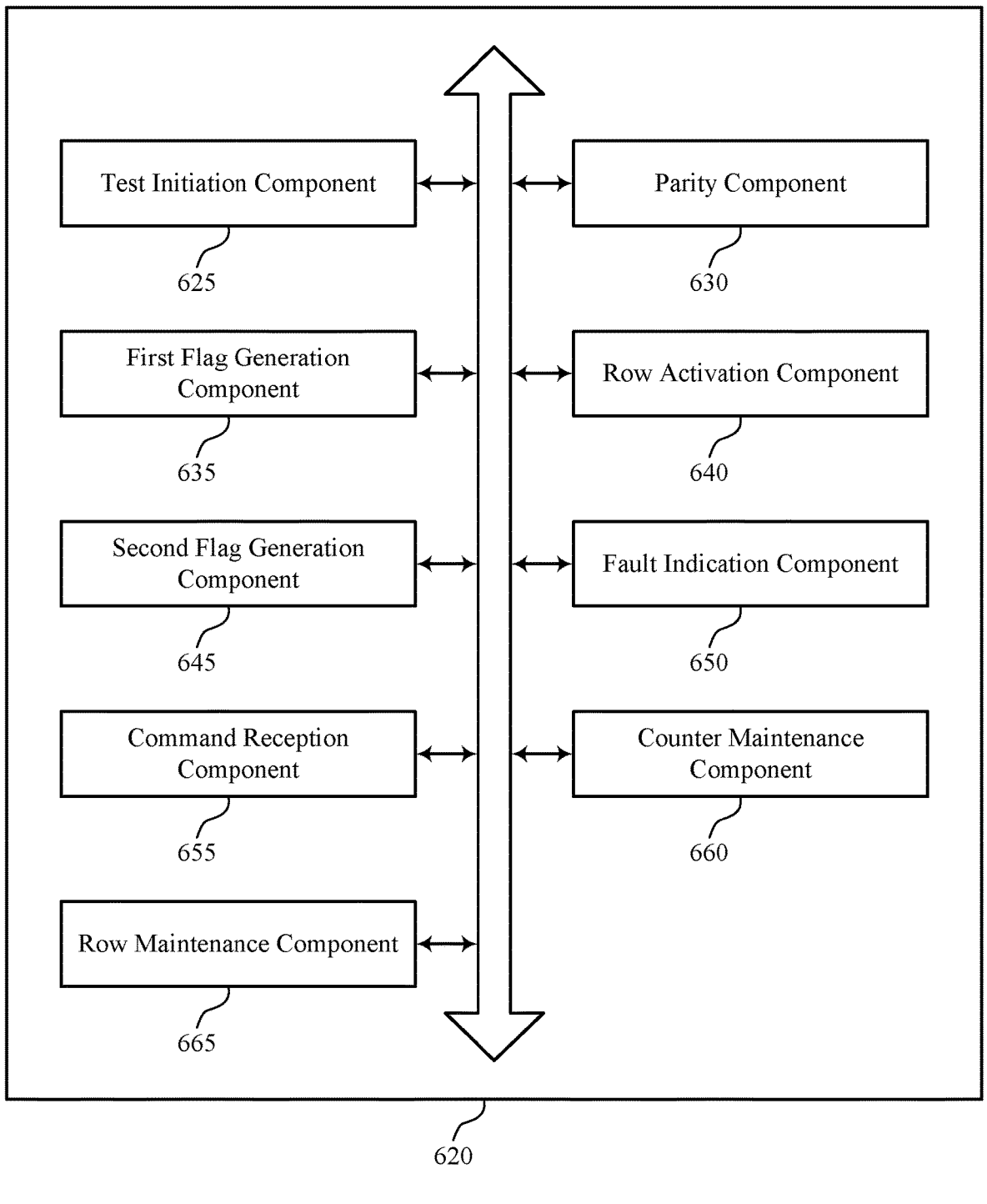
FIG. 6 shows a block diagram of a memory system that supports testing operations for memory systems in accordance with examples as disclosed herein.

FIG. 6 shows a block diagram 600 of a memory system 620 that supports testing operations for memory systems in accordance with examples as disclosed herein. The memory system 620 may be an example of aspects of a memory system as described with reference to FIGS. 1 through 5. The memory system 620, or various components thereof, may be an example of means for performing various aspects of testing operations for memory systems as described herein. For example, the memory system 620 may include a test initiation component 625, a parity component 630, a first flag generation component 635, a row activation component 640, a second flag generation component 645, a fault indication component 650, a command reception component 655, a counter maintenance component 660, a row maintenance component 665, or any combination thereof. Each of these components may communicate, directly or indirectly, with one another (e.g., via one or more buses).

The test initiation component 625 may be configured as or otherwise support a means for initiating, by a memory system, a testing operation on a set of counter bits stored to a row of memory cells, where the set of counter bits indicates a value of a counter, the counter tracking a quantity of activates to the row of memory cells. The parity component 630 may be configured as or otherwise support a means for comparing, by a first circuit coupled with the row of memory cells, the set of counter bits to a set of parity bits stored to the first circuit based at least in part on initiating the testing operation. The first flag generation component 635 may be configured as or otherwise support a means for generating a first flag based at least in part on comparing the set of counter bits to the set of parity bits, where the first flag indicates a result of comparing the set of counter bits to the set of parity bits. The row activation component 640 may be configured as or otherwise support a means for activating the row of memory cells a first quantity of times based at least in part on generating the first flag, where activating the row of memory cells increments the value of the counter. The second flag generation component 645 may be configured as or otherwise support a means for generating, by a second circuit coupled with the row of memory cells, a second flag based at least in part on activating the row of memory cells, where the second flag indicates an error condition associated with the counter. The fault indication component 650 may be configured as or otherwise support a means for outputting an indication of a fault to an external device via a global input/output (GIO) line coupled with the first circuit and the second circuit based at least in part on the first flag and the second flag.

In some examples, to support comparing the set of counter bits to the set of parity bits, the parity component 630 may be configured as or otherwise support a means for comparing a first subset of the set of counter bits to a first subset of the set of parity bits. In some examples, to support comparing the set of counter bits to the set of parity bits, the parity component 630 may be configured as or otherwise support a means for determining that the first subset of the set of counter bits matches the first subset of the set of parity bits.

In some examples, to support comparing the set of counter bits to the set of parity bits, the parity component 630 may be configured as or otherwise support a means for comparing a first subset of the set of counter bits to a first subset of the set of parity bits. In some examples, to support comparing the set of counter bits to the set of parity bits, the parity component 630 may be configured as or otherwise support a means for determining that the first subset of the set of counter bits matches the first subset of the set of parity bits. In some examples, to support comparing the set of counter bits to the set of parity bits, the parity component 630 may be configured as or otherwise support a means for comparing a second subset of the set of counter bits to a second subset of the set of parity bits based at least in part on determining that the first subset of the set of counter bits matches the first subset of the set of parity bits. In some examples, to support comparing the set of counter bits to the set of parity bits, the parity component 630 may be configured as or otherwise support a means for determining that the second subset of the set of counter bits matches the second subset of the set of parity bits.

In some examples, the command reception component 655 may be configured as or otherwise support a means for receiving a command to access the row of memory cells. In some examples, the counter maintenance component 660 may be configured as or otherwise support a means for incrementing, by the second circuit, the value of the counter based at least in part on receiving the command. In some examples, the parity component 630 may be configured as or otherwise support a means for generating, by the first circuit, the set of parity bits based at least in part on incrementing the value of the counter. In some examples, the parity component 630 may be configured as or otherwise support a means for storing the set of parity bits in the first circuit.

In some examples, to support generating the second flag, the counter maintenance component 660 may be configured as or otherwise support a means for determining a first error in a third subset of the set of counter bits based at least in part on activating the row of memory cells the first quantity of times, where the first error indicates an error associated with the counter.

In some examples, the counter maintenance component 660 may be configured as or otherwise support a means for determining a second error in a fourth subset of the set of counter bits based at least in part on activating the row of memory cells the first quantity of times, where the second error indicates an error associated with the counter.

In some examples, determining the first error and determining the second error occurs concurrently.

In some examples, to support determining the second error, the row activation component 640 may be configured as or otherwise support a means for activating the row of memory cells a second quantity of times after activating the row of memory cells the first quantity of times.

In some examples, the command reception component 655 may be configured as or otherwise support a means for receiving a command to discard the row of memory cells based at least in part on outputting the indication of the fault to the external device. In some examples, the row maintenance component 665 may be configured as or otherwise support a means for discarding the row of memory cells.

In some examples, the indication of the fault output to the external device includes one or more encoded bits.

Figure 7:
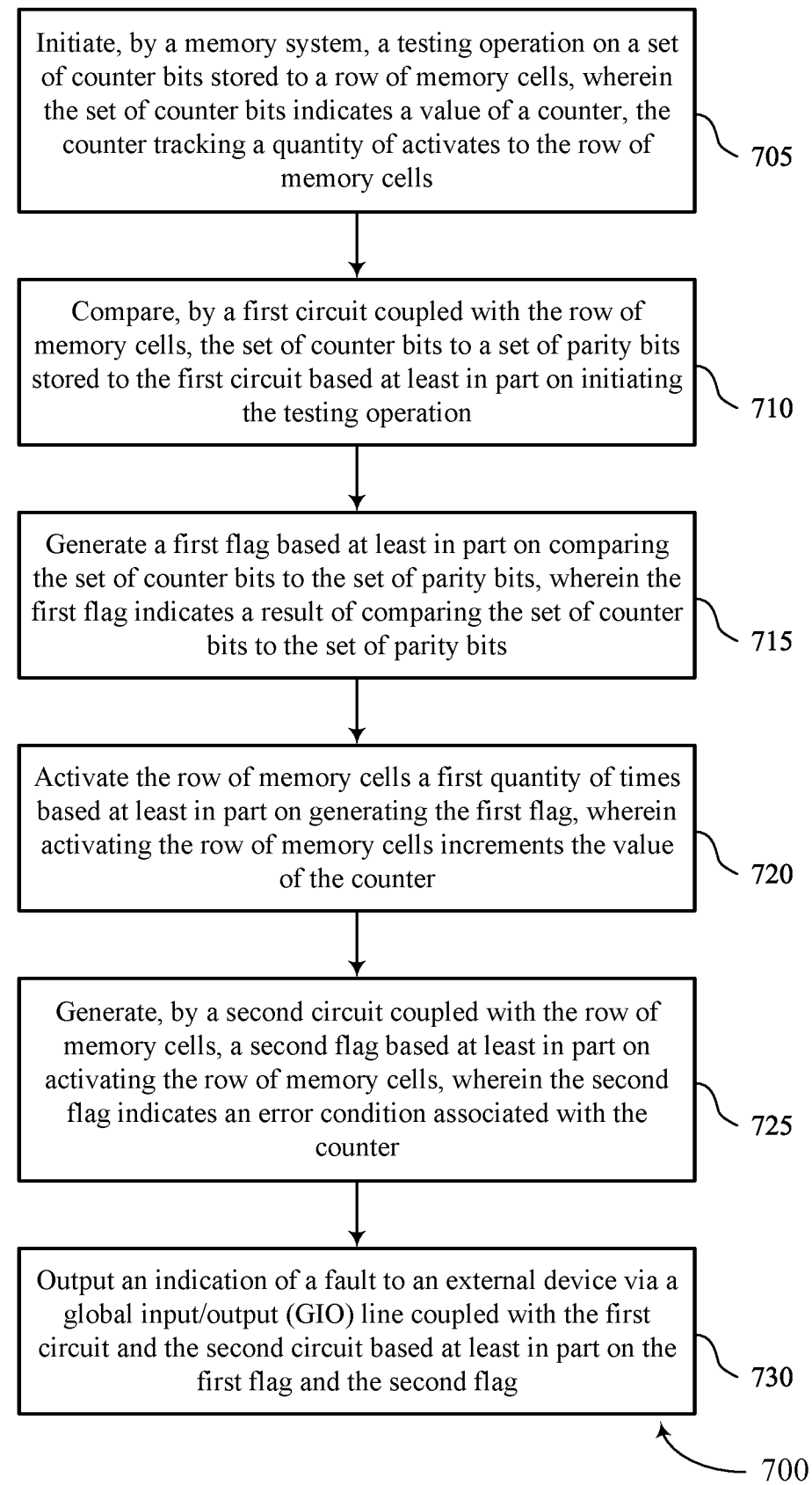
FIG. 7 shows a flowchart illustrating a method or methods that support testing operations for memory systems in accordance with examples as disclosed herein.

FIG. 7 shows a flowchart illustrating a method 700 that supports testing operations for memory systems in accordance with examples as disclosed herein. The operations of method 700 may be implemented by a memory system or its components as described herein. For example, the operations of method 700 may be performed by a memory system as described with reference to FIGS. 1 through 6. In some examples, a memory system may execute a set of instructions to control the functional elements of the device to perform the described functions. Additionally, or alternatively, the memory system may perform aspects of the described functions using special-purpose hardware.

At 705, the method may include initiating, by a memory system, a testing operation on a set of counter bits stored to a row of memory cells, where the set of counter bits indicates a value of a counter, the counter tracking a quantity of activates to the row of memory cells. The operations of 705 may be performed in accordance with examples as disclosed herein. In some examples, aspects of the operations of 705 may be performed by a test initiation component 625 as described with reference to FIG. 6.

At 710, the method may include comparing, by a first circuit coupled with the row of memory cells, the set of counter bits to a set of parity bits stored to the first circuit based at least in part on initiating the testing operation. The operations of 710 may be performed in accordance with examples as disclosed herein. In some examples, aspects of the operations of 710 may be performed by a parity component 630 as described with reference to FIG. 6.

At 715, the method may include generating a first flag based at least in part on comparing the set of counter bits to the set of parity bits, where the first flag indicates a result of comparing the set of counter bits to the set of parity bits. The operations of 715 may be performed in accordance with examples as disclosed herein. In some examples, aspects of the operations of 715 may be performed by a first flag generation component 635 as described with reference to FIG. 6.

At 720, the method may include activating the row of memory cells a first quantity of times based at least in part on generating the first flag, where activating the row of memory cells increments the value of the counter. The operations of 720 may be performed in accordance with examples as disclosed herein. In some examples, aspects of the operations of 720 may be performed by a row activation component 640 as described with reference to FIG. 6.

At 725, the method may include generating, by a second circuit coupled with the row of memory cells, a second flag based at least in part on activating the row of memory cells, where the second flag indicates an error condition associated with the counter. The operations of 725 may be performed in accordance with examples as disclosed herein. In some examples, aspects of the operations of 725 may be performed by a second flag generation component 645 as described with reference to FIG. 6.

At 730, the method may include outputting an indication of a fault to an external device via a global input/output (GIO) line coupled with the first circuit and the second circuit based at least in part on the first flag and the second flag. The operations of 730 may be performed in accordance with examples as disclosed herein. In some examples, aspects of the operations of 730 may be performed by a fault indication component 650 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for initiating, by a memory system, a testing operation on a set of counter bits stored to a row of memory cells, where the set of counter bits indicates a value of a counter, the counter tracking a quantity of activates to the row of memory cells; comparing, by a first circuit coupled with the row of memory cells, the set of counter bits to a set of parity bits stored to the first circuit based at least in part on initiating the testing operation; generating a first flag based at least in part on comparing the set of counter bits to the set of parity bits, where the first flag indicates a result of comparing the set of counter bits to the set of parity bits; activating the row of memory cells a first quantity of times based at least in part on generating the first flag, where activating the row of memory cells increments the value of the counter; generating, by a second circuit coupled with the row of memory cells, a second flag based at least in part on activating the row of memory cells, where the second flag indicates an error condition associated with the counter; and outputting an indication of a fault to an external device via a global input/output (GIO) line coupled with the first circuit and the second circuit based at least in part on the first flag and the second flag.

Aspect 2: The method, apparatus, or non-transitory computer-readable medium of aspect 1, where comparing the set of counter bits to the set of parity bits includes operations, features, circuitry, logic, means, or instructions, or any combination thereof for comparing a first subset of the set of counter bits to a first subset of the set of parity bits and determining that the first subset of the set of counter bits matches the first subset of the set of parity bits.

Aspect 3: The method, apparatus, or non-transitory computer-readable medium of any of aspects 1 through 2, where comparing the set of counter bits to the set of parity bits includes operations, features, circuitry, logic, means, or instructions, or any combination thereof for comparing a first subset of the set of counter bits to a first subset of the set of parity bits; determining that the first subset of the set of counter bits matches the first subset of the set of parity bits; comparing a second subset of the set of counter bits to a second subset of the set of parity bits based at least in part on determining that the first subset of the set of counter bits matches the first subset of the set of parity bits; and determining that the second subset of the set of counter bits matches the second subset of the set of parity bits.

Aspect 4: The method, apparatus, or non-transitory computer-readable medium of any of aspects 1 through 3, further including operations, features, circuitry, logic, means, or instructions, or any combination thereof for receiving a command to access the row of memory cells; incrementing, by the second circuit, the value of the counter based at least in part on receiving the command; generating, by the first circuit, the set of parity bits based at least in part on incrementing the value of the counter; and storing the set of parity bits in the first circuit.

Aspect 5: The method, apparatus, or non-transitory computer-readable medium of any of aspects 1 through 4, where generating the second flag includes operations, features, circuitry, logic, means, or instructions, or any combination thereof for determining a first error in a third subset of the set of counter bits based at least in part on activating the row of memory cells the first quantity of times, where the first error indicates an error associated with the counter.

Aspect 6: The method, apparatus, or non-transitory computer-readable medium of aspect 5, further including operations, features, circuitry, logic, means, or instructions, or any combination thereof for determining a second error in a fourth subset of the set of counter bits based at least in part on activating the row of memory cells the first quantity of times, where the second error indicates an error associated with the counter.

Aspect 7: The method, apparatus, or non-transitory computer-readable medium of aspect 6, where determining the first error and determining the second error occurs concurrently.

Aspect 8: The method, apparatus, or non-transitory computer-readable medium of any of aspects 6 through 7, where determining the second error further includes operations, features, circuitry, logic, means, or instructions, or any combination thereof for activating the row of memory cells a second quantity of times after activating the row of memory cells the first quantity of times.

Aspect 9: The method, apparatus, or non-transitory computer-readable medium of any of aspects 1 through 8, further including operations, features, circuitry, logic, means, or instructions, or any combination thereof for receiving a command to discard the row of memory cells based at least in part on outputting the indication of the fault to the external device and discarding the row of memory cells.

Aspect 10: The method, apparatus, or non-transitory computer-readable medium of any of aspects 1 through 9, where the indication of the fault output to the external device includes one or more encoded bits.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 11: An apparatus, including: a row of memory cells configured to store data and a set of counter bits indicating a value of a counter associated with the row of memory cells, the counter tracking a quantity of times the row of memory cells is activated; a global input/output (GIO) line; a first circuit coupled with the row of memory cells and the GIO line and configured to compare the set of counter bits to a set of parity bits stored to the first circuit and generate a first flag based at least in part on comparing the set of counter bits with the set of parity bits, where the first flag indicates a result of the set of counter bits being compared to the set of parity bits; and a second circuit coupled with the first circuit and the GIO line and configured to generate, in response to the row of memory cells being activated a first quantity of times, a second flag and output an indication of a fault to an external device via the GIO line based at least in part on the first flag and the second flag, where the second flag indicates an error associated with the counter.

Aspect 12: The apparatus of aspect 11, where the first circuit is coupled with a first bank of memory cells and a second bank of memory cells, the first bank of memory cells including the row of memory cells.

Aspect 13: The apparatus of any of aspects 11 through 12, where the first circuit is configured to generate the first flag by: comparing a first subset of the set of counter bits to a first subset of the set of parity bits; and determining that the first subset of the set of counter bits does not match the first subset of the set of parity bits.

Aspect 14: The apparatus of any of aspects 11 through 13, where the first circuit is configured to generate the first flag by: comparing a first subset of the set of counter bits to a first subset of the set of parity bits; determining that the first subset of the set of counter bits matches the first subset of the set of parity bits; comparing a second subset of the set of counter bits to a second subset of the set of parity bits based at least in part on determining that the first subset of the set of counter bits matches the first subset of the set of parity bits; and determining that the second subset of the set of counter bits does not match the second subset of the set of parity bits.

Aspect 15: The apparatus of any of aspects 11 through 14, where the second circuit is configured to increment the value of the counter, and where the first circuit is configured to: generate the set of parity bits based at least in part on incrementing the value of the counter; and store the set of parity bits to the first circuit.

Aspect 16: The apparatus of any of aspects 11 through 15, where the second circuit is configured to generate the second flag by: determining a first error in a third subset of the set of counter bits based at least in part on activating the row of memory cells the first quantity of times, where the first error indicates an error associated with the counter.

Aspect 17: The apparatus of aspect 16, where the second circuit is further configured to: determine a second error in a fourth subset of the set of counter bits based at least in part on activating the row of memory cells the first quantity of times.

Aspect 18: The apparatus of aspect 17, where determining the first error and determining the second error occurs concurrently.

An apparatus is described. The following provides an overview of aspects of the apparatus as described herein:

Aspect 19: An apparatus, including: a memory device; a global input/output (GIO) line coupled with the memory device; and circuitry coupled with the memory device and the GIO line, where the circuitry is configured to cause the memory device to: initiate a testing operation on a set of counter bits stored to a row of memory cells, where the set of counter bits indicates a value of a counter, the counter tracking a quantity of activates to the row of memory cells; compare the set of counter bits to a set of parity bits stored to the circuitry based at least in part on initiating the testing operation; generating a first flag based at least in part on comparing the set of counter bits to the set of parity bits, where the first flag indicates a result of comparing the set of counter bits to the set of parity bits; activate the row of memory cells a first quantity of times based at least in part on generating the first flag, where activating the row of memory cells increments the value of the counter; generate a second flag based at least in part on activating the row of memory cells, where the second flag indicates an error condition associated with the counter; and output an indication of a fault to an external device via the GIO line based at least in part on the first flag and the second flag.

Aspect 20: The apparatus of aspect 19, where comparing the set of counter bits to the set of parity bits includes: comparing a first subset of the set of counter bits to a first subset of the set of parity bits; and determining that the first subset of the set of counter bits matches the first subset of the set of parity bits.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   initiating, by a memory system, a testing operation on a set of counter bits stored to a row of memory cells, wherein the set of counter bits indicates a value of a counter, the counter tracking a quantity of activates to the row of memory cells;
   comparing, by a first circuit coupled with the row of memory cells, the set of counter bits to a set of parity bits stored to the first circuit based at least in part on initiating the testing operation;
   generating a first flag based at least in part on comparing the set of counter bits to the set of parity bits, wherein the first flag indicates a result of comparing the set of counter bits to the set of parity bits;
   activating the row of memory cells a first quantity of times based at least in part on generating the first flag, wherein activating the row of memory cells increments the value of the counter;
   generating, by a second circuit coupled with the row of memory cells, a second flag based at least in part on activating the row of memory cells, wherein the second flag indicates an error condition associated with the counter; and
   outputting an indication of a fault to an external device via a global input/output (GIO) line coupled with the first circuit and the second circuit based at least in part on the first flag and the second flag.

2. The method of claim 1, wherein comparing the set of counter bits to the set of parity bits comprises:
   comparing a first subset of the set of counter bits to a first subset of the set of parity bits; and
   determining that the first subset of the set of counter bits matches the first subset of the set of parity bits.

3. The method of claim 1, wherein comparing the set of counter bits to the set of parity bits comprises:
   comparing a first subset of the set of counter bits to a first subset of the set of parity bits;
   determining that the first subset of the set of counter bits matches the first subset of the set of parity bits;
   comparing a second subset of the set of counter bits to a second subset of the set of parity bits based at least in part on determining that the first subset of the set of counter bits matches the first subset of the set of parity bits; and
   determining that the second subset of the set of counter bits matches the second subset of the set of parity bits.

4. The method of claim 1, further comprising:
   receiving a command to access the row of memory cells;
   incrementing, by the second circuit, the value of the counter based at least in part on receiving the command;
   generating, by the first circuit, the set of parity bits based at least in part on incrementing the value of the counter; and
   storing the set of parity bits in the first circuit.

5. The method of claim 1, wherein generating the second flag comprises:
   determining a first error in a third subset of the set of counter bits based at least in part on activating the row of memory cells the first quantity of times, wherein the first error indicates an error associated with the counter.

6. The method of claim 5, further comprising:
   determining a second error in a fourth subset of the set of counter bits based at least in part on activating the row of memory cells the first quantity of times, wherein the second error indicates an error associated with the counter.

7. The method of claim 6, wherein determining the first error and determining the second error occurs concurrently.

8. The method of claim 6, wherein determining the second error further comprises:
   activating the row of memory cells a second quantity of times after activating the row of memory cells the first quantity of times.

9. The method of claim 1, further comprising:
   receiving a command to discard the row of memory cells based at least in part on outputting the indication of the fault to the external device; and
   discarding the row of memory cells.

10. The method of claim 1, wherein the indication of the fault output to the external device comprises one or more encoded bits.

11. A memory system, comprising:
    a row of memory cells configured to store data and a set of counter bits indicating a value of a counter associated with the row of memory cells, the counter tracking a quantity of times the row of memory cells is activated;

a global input/output (GIO) line;

a first circuit coupled with the row of memory cells and the GIO line and configured to compare the set of counter bits to a set of parity bits stored to the first circuit and generate a first flag based at least in part on comparing the set of counter bits with the set of parity bits, wherein the first flag indicates a result of the set of counter bits being compared to the set of parity bits; and a second circuit coupled with the first circuit and the GIO line and configured to generate, in response to the row of memory cells being activated a first quantity of times, a second flag and output an indication of a fault to an external device via the GIO line based at least in part on the first flag and the second flag, wherein the second flag indicates an error associated with the counter.

12. The memory system of claim 11, wherein the first circuit is coupled with a first bank of memory cells and a second bank of memory cells, the first bank of memory cells comprising the row of memory cells.

13. The memory system of claim 11, wherein the first circuit is configured to generate the first flag by:
comparing a first subset of the set of counter bits to a first subset of the set of parity bits; and
determining that the first subset of the set of counter bits does not match the first subset of the set of parity bits.

14. The memory system of claim 11, wherein the first circuit is configured to generate the first flag by:
comparing a first subset of the set of counter bits to a first subset of the set of parity bits;
determining that the first subset of the set of counter bits matches the first subset of the set of parity bits;
comparing a second subset of the set of counter bits to a second subset of the set of parity bits based at least in part on determining that the first subset of the set of counter bits matches the first subset of the set of parity bits; and
determining that the second subset of the set of counter bits does not match the second subset of the set of parity bits.

15. The memory system of claim 11, wherein the second circuit is configured to increment the value of the counter, and wherein the first circuit is configured to:
generate the set of parity bits based at least in part on incrementing the value of the counter; and
store the set of parity bits to the first circuit.

16. The memory system of claim 11, wherein the second circuit is configured to generate the second flag by:
determining a first error in a third subset of the set of counter bits based at least in part on activating the row of memory cells the first quantity of times, wherein the first error indicates an error associated with the counter.

17. The memory system of claim 16, wherein the second circuit is further configured to:
determine a second error in a fourth subset of the set of counter bits based at least in part on activating the row of memory cells the first quantity of times.

18. The memory system of claim 17, wherein determining the first error and determining the second error occurs concurrently.

19. A memory system, comprising:
one or more memory devices;
a global input/output (GIO) line coupled with the one or more memory devices; and
circuitry coupled with the one or more memory devices and the GIO line, wherein the circuitry is configured to cause the one or more memory devices to:
initiate a testing operation on a set of counter bits stored to a row of memory cells, wherein the set of counter bits indicates a value of a counter, the counter tracking a quantity of activates to the row of memory cells;
compare the set of counter bits to a set of parity bits stored to the circuitry based at least in part on initiating the testing operation; generating a first flag based at least in part on comparing the set of counter bits to the set of parity bits, wherein the first flag indicates a result of comparing the set of counter bits to the set of parity bits;
activate the row of memory cells a first quantity of times based at least in part on generating the first flag, wherein activating the row of memory cells increments the value of the counter;
generate a second flag based at least in part on activating the row of memory cells, wherein the second flag indicates an error condition associated with the counter; and
output an indication of a fault to an external device via the GIO line based at least in part on the first flag and the second flag.

20. The memory system of claim 19, wherein comparing the set of counter bits to the set of parity bits comprises:
comparing a first subset of the set of counter bits to a first subset of the set of parity bits; and
determining that the first subset of the set of counter bits matches the first subset of the set of parity bits.

* * * * *